(12) United States Patent
Kawasaki

(10) Patent No.: US 11,043,932 B2
(45) Date of Patent: Jun. 22, 2021

(54) SURFACE ACOUSTIC WAVE DEVICE

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/529,879

(22) Filed: Aug. 2, 2019

(65) Prior Publication Data

US 2019/0356299 A1    Nov. 21, 2019

Related U.S. Application Data

(63) Continuation of application No. PCT/JP2018/002253, filed on Jan. 25, 2018.

(30) Foreign Application Priority Data

Feb. 3, 2017    (JP) .............................. JP2017-018685

(51) Int. Cl.
| | |
|---|---|
| *H03H 9/10* | (2006.01) |
| *H03H 9/25* | (2006.01) |
| *H03H 9/64* | (2006.01) |
| *H03H 9/02* | (2006.01) |
| *H03H 9/05* | (2006.01) |

(Continued)

(52) U.S. Cl.
CPC ...... *H03H 9/1092* (2013.01); *H03H 9/02543* (2013.01); *H03H 9/02559* (2013.01);
(Continued)

(58) Field of Classification Search
CPC .............. H03H 9/059; H03H 9/02543; H03H 9/02559; H03H 9/1092; H03H 9/145;
(Continued)

(56) References Cited

U.S. PATENT DOCUMENTS

2005/0285699 A1* 12/2005 Yokota ..................... H03H 9/72
                                                                        333/133
2008/0018415 A1    1/2008 Miyaji
(Continued)

FOREIGN PATENT DOCUMENTS

| JP | 11-163668 A | 6/1999 |
|---|---|---|
| JP | 2005-033689 A | 2/2005 |

(Continued)

OTHER PUBLICATIONS

Official Communication issued in corresponding Japanese Patent Application No. 2018-565489, dated Aug. 25, 2020.

(Continued)

*Primary Examiner* — Robert J Pascal
*Assistant Examiner* — Jorge L Salazar, Jr.
(74) *Attorney, Agent, or Firm* — Keating & Bennett, LLP

(57) ABSTRACT

A surface acoustic wave device includes a piezoelectric substrate, functional elements on the piezoelectric substrate, a cover portion that opposes the piezoelectric substrate with a support layer interposed therebetween, and an input/output terminal on the cover portion. At least a portion of the functional elements includes an interdigital transducer electrode, and a surface acoustic wave resonator is defined by the piezoelectric substrate and the IDT electrode. The functional elements include a filter that passes a signal in a predetermined frequency band, and a cancel circuit which is connected in parallel to the filter and attenuates a signal outside the predetermined frequency band in signals output from the output terminal. A portion of a wiring pattern connecting a first functional element and a second functional element included in the plurality of functional elements is provided on the cover portion.

20 Claims, 6 Drawing Sheets

(51) Int. Cl.
*H03H 9/145* (2006.01)
*H03H 9/68* (2006.01)
*H03H 9/72* (2006.01)
*H03H 9/54* (2006.01)

(52) U.S. Cl.
CPC ............ *H03H 9/059* (2013.01); *H03H 9/145* (2013.01); *H03H 9/25* (2013.01); *H03H 9/542* (2013.01); *H03H 9/6483* (2013.01); *H03H 9/6489* (2013.01); *H03H 9/68* (2013.01); *H03H 9/725* (2013.01)

(58) Field of Classification Search
CPC .......... H03H 9/25; H03H 9/6483; H03H 9/68; H03H 9/725; H03H 9/542; H03H 9/1071; H03H 9/6489; H03H 9/6436
USPC .......................................... 333/133, 193–196
See application file for complete search history.

(56) References Cited

U.S. PATENT DOCUMENTS

2008/0266023 A1 10/2008 Tanaka
2013/0314173 A1 11/2013 Inoue
2016/0164491 A1* 6/2016 Muto .................... H03H 9/725
   333/133
2016/0277006 A1 9/2016 Kaneda et al.
2018/0013404 A1 1/2018 Kawasaki et al.

FOREIGN PATENT DOCUMENTS

| | | |
|---|---|---|
| JP | 2007-281902 A | 10/2007 |
| JP | 2008-028713 A | 2/2008 |
| JP | 4670872 B2 | 4/2011 |
| JP | 2013-247466 A | 12/2013 |
| JP | 5733791 B2 | 6/2015 |
| JP | 2016-178621 A | 10/2016 |
| JP | 2017-022501 A | 1/2017 |
| JP | 2018-006931 A | 1/2018 |
| WO | 2016/208287 A1 | 12/2016 |

OTHER PUBLICATIONS

Official Communication issued in International Patent Application No. PCT/JP2018/002253, dated Apr. 3, 2018.

* cited by examiner

SURFACE ACOUSTIC WAVE DEVICE

CROSS REFERENCE TO RELATED APPLICATIONS

This application claims the benefit of priority to Japanese Patent Application No. 2017-018685 filed on Feb. 3, 2017 and is a Continuation Application of PCT Application No. PCT/JP2018/002253 filed on Jan. 25, 2018. The entire contents of each application are hereby incorporated herein by reference.

BACKGROUND OF THE INVENTION

1. Field of the Invention

The present invention relates to a surface acoustic wave device and, more particularly, to a technique for reducing a size of a surface acoustic wave device.

2. Description of the Related Art

A surface acoustic wave filter using a surface acoustic wave (SAW) resonator is typically used in an electronic device such as a cellular phone, a smartphone, or the like.

In recent years, along with the miniaturization and high performance of these electronic devices, there has been a demand for reducing the size of the electronic components to be used and increasing the density of the electronic components, so that the surface acoustic wave resonator is also required to be miniaturized. In general, since the surface acoustic wave resonator has a structure in which a large number of comb-shaped electrodes (IDT: interdigital transducer) are arranged on a piezoelectric substrate, it is important to reduce a surface area of the piezoelectric substrate for the miniaturization of the surface acoustic wave resonator.

Japanese Patent No. 5733791 discloses a surface acoustic wave device having a structure in which a functional element such as an IDT electrode is arranged on a main surface of a piezoelectric substrate, a wiring electrode for connecting to an external device or the like is arranged on a surface opposite to the main surface of the piezoelectric substrate, and the functional element and the wiring electrode are connected by a through-electrode.

Japanese Patent No. 4670872 discloses a surface acoustic wave device in which a portion of a signal line is arranged on a cover portion provided on a piezoelectric substrate to form a vibration space, thus reducing capacitive coupling between signal lines accompanying miniaturization of the surface acoustic wave device.

Such a surface acoustic wave device may be used as a band-pass filter passing a signal in a specific frequency band (pass band). In the band-pass filter, it is desirable that an attenuation amount in the frequency band (blocking band) outside the above described pass band is large.

In such a case, a configuration is known in which an additional circuit is added in parallel to the filter to ensure the attenuation amount in the blocking band. The additional circuit, in general, generates a signal component having a phase opposite to that of the signal passing through a filter unit, and adds the signal component to an output signal, thus offsetting an amplitude of the output signal in the blocking band to secure the attenuation amount.

On the other hand, when such an additional circuit is provided on the surface acoustic wave device, additional surface area on a piezoelectric substrate is required. Therefore, there may be a case where a device size of the surface acoustic wave device is increased, or a case where wiring patterns intersect on the piezoelectric substrate in an insulating manner.

SUMMARY OF THE INVENTION

Preferred embodiments of the present invention provide surface acoustic wave devices each including a cancel circuit that secures an attenuation amount in a blocking band of a filter, which is capable of reducing or preventing an increase in the size of the device and improving the degree of freedom in design.

A surface acoustic wave device according to a preferred embodiment of the present invention includes a piezoelectric substrate, a plurality of functional elements on the piezoelectric substrate, a cover portion that opposes the piezoelectric substrate with a support layer interposed therebetween, and an input terminal and an output terminal provided on the cover portion. At least a portion of the plurality of functional elements includes an interdigital transducer (IDT) electrode, and a surface acoustic wave resonator is defined by the piezoelectric substrate and the IDT electrode. The plurality of functional elements include a filter that passes a signal in a predetermined frequency band in input signals from the input terminal to the output terminal, and a cancel circuit connected to the filter in parallel between the input terminal and the output terminal. The cancel circuit attenuates a signal outside the predetermined frequency band in signals output from the output terminal. A portion of a wiring pattern connecting a first functional element and a second functional element included in the plurality of functional elements is provided on the cover portion.

Preferably, the surface acoustic wave device further includes a first through-electrode and a second through-electrode passing through the support layer and the cover portion. The wiring pattern on the cover portion is connected to the first functional element by the first through-electrode, and is connected to the second functional element by the second through-electrode.

Preferably, the surface acoustic wave device further includes a protective resin covering a second surface opposite to a first surface facing the piezoelectric substrate, on the cover portion. A wiring pattern on the cover portion is provided between the protective resin and the second surface of the cover portion. The wiring pattern on the cover portion is connected to the first functional element via a first wiring on a first side surface of the cover portion, and is connected to the second functional element via a second wiring on a second side surface of the cover portion.

Preferably, when the piezoelectric substrate is viewed in a plan view, at least a portion of a wiring pattern on the piezoelectric substrate intersects with the wiring pattern on the cover portion.

Preferably, when the piezoelectric substrate is viewed in a plan view, a portion of the plurality of functional elements overlaps with the wiring pattern on the cover portion.

Preferably, at least a portion of a wiring pattern connecting the functional elements included in the filter to each other and at least a portion of a wiring pattern extending from the input terminal to the output terminal through the cancel circuit are provided on the cover portion.

Preferably, the first functional element is the filter, and the second functional element is the cancel circuit. At least a portion of a wiring pattern connecting the filter and the cancel circuit is provided on the cover portion.

Preferably when the filter is a reception filter, the input terminal is connected to an antenna, the output terminal is connected to a reception circuit, and the cancel circuit is connected in parallel to the reception filter.

Preferably, when the filter is a transmission filter, the input terminal is connected to a transmission circuit, the output terminal is connected to the antenna, and the cancel circuit is connected in parallel to the transmission filter.

Preferably, the cancel circuit includes an amplitude adjustment circuit that adjusts an amplitude of the input signal, and a phase adjustment circuit that adjusts a phase of the input signal. The first functional element is the amplitude adjustment circuit, and the second functional element is the phase adjustment circuit. At least a portion of a wiring pattern connecting the amplitude adjustment circuit and the phase adjustment circuit is provided on the cover portion.

Preferably, the cancel circuit includes first and second amplitude adjustment circuits and the phase adjustment circuit. The first amplitude adjustment circuit adjusts the amplitude of the input signal. The phase adjustment circuit adjusts a phase of a signal from the first amplitude adjustment circuit. The second amplitude adjustment circuit adjusts an amplitude of a signal from the phase adjustment circuit. The first functional element is the phase adjustment circuit, and the second functional element is at least one of the first amplitude adjustment circuit and the second amplitude adjustment circuit. At least one of a wiring pattern connecting the first amplitude adjustment circuit and the phase adjustment circuit, and a wiring pattern connecting the phase adjustment circuit and the second amplitude adjustment circuit is provided on the cover portion.

Preferably, the filter includes the transmission filter and the reception filter. The transmission filter filters a signal from the transmission circuit received at a first terminal, and outputs the filtered signal to the antenna. The reception filter filters a signal received from the antenna and outputs the filtered signal to the reception circuit from a second terminal. The cancel circuit reduces the influence of the signal received at the first terminal on the signal output from the second terminal. A portion of a wiring pattern connected to the second terminal from the first terminal through the cancel circuit is provided on the cover portion.

Preferably, the piezoelectric substrate is made of a single crystal material of any one of lithium tantalate (LiTaO$_3$), lithium niobate (LiNbO$_3$), alumina (Al$_2$O$_3$), and sapphire, or a laminated material made of LiTaO$_3$, LiNbO$_3$, or silicon (Si).

According to surface acoustic wave devices according to preferred embodiments of the present invention, by providing a portion of a wiring pattern connecting functional elements of a filter and/or a portion of a wiring pattern connecting the filter and a cancel circuit on a cover portion of the surface acoustic wave device, a space on a piezoelectric substrate which is required due to the addition of the cancel circuit is able to be reduced. It is also possible to eliminate the intersection of the wiring patterns on the piezoelectric substrate. Therefore, attenuation characteristics in a blocking band are improved by adding the cancel circuit, and also, it is possible to reduce or prevent the increase in size of the surface acoustic wave device and to improve the degree of freedom in design.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings. The same or corresponding portions in the figures are denoted by the same reference signs, and the description thereof will not be repeated.

Figure 1:
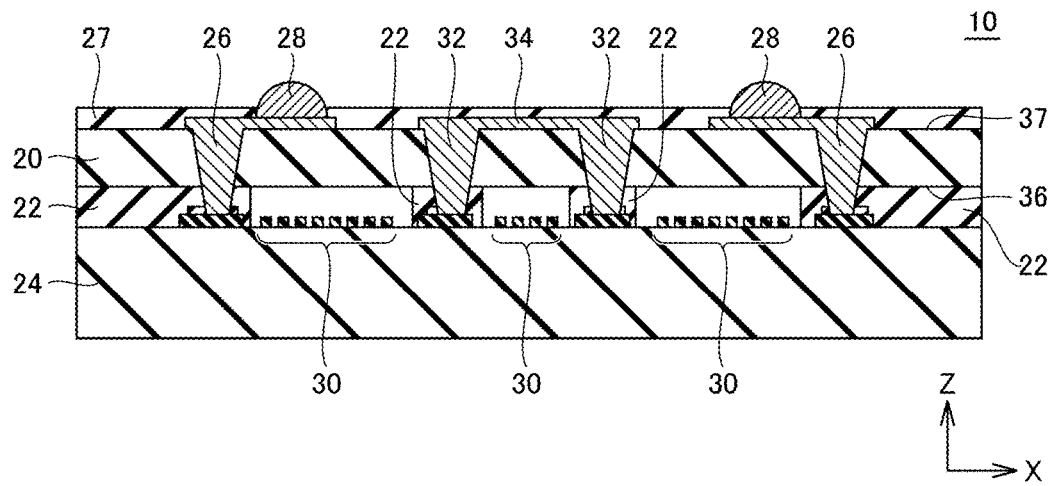
FIG. 1 is a cross-sectional view of a surface acoustic wave device according to a preferred embodiment of the present invention.

FIG. 1 illustrates a cross-sectional view of an example of a surface acoustic wave device 10 according to a present preferred embodiment of the present invention. Referring to FIG. 1, the surface acoustic wave device 10 preferably includes a cover portion 20, a support layer 22, a piezoelectric substrate 24, and a protective resin 27.

The piezoelectric substrate 24 is preferably made of, for example, a piezoelectric single crystal material such as lithium tantalate (LiTaO$_3$), lithium niobate (LiNbO$_3$), alumina (Al$_2$O$_3$), and sapphire, or a piezoelectric laminated material made of LiTaO$_3$, LiNbO$_3$, or silicon (Si). A plurality of functional elements 30 are provided on the piezoelectric substrate 24. The functional element preferably includes, for example, a pair of IDT electrodes made using an electrode material, such as a single metal composed of at least one kind selected from aluminum, copper, silver, gold, titanium, tungsten, platinum, chromium, nickel and molybdenum, or an alloy containing these as a main component. A surface acoustic wave resonator is defined by the piezoelectric substrate 24 and the IDT electrode.

The support layer 22 is provided on the piezoelectric substrate 24. By arranging the cover portion 20 to oppose a surface of the piezoelectric substrate 24 on which the functional element 30 is provided with the support layer 22 interposed therebetween, a space is provided around the plurality of functional elements 30 including the IDT electrode. In this way, a surface acoustic wave propagates in a portion of the piezoelectric substrate 24 adjacent to the space.

In the cover portion 20, a protective resin 27 is preferably laminated on a surface 37 opposite to a surface 36 opposed to the piezoelectric substrate 24. A plurality of terminal electrodes 28 are provided on the protective resin 27. The terminal electrode 28 is a terminal to be electrically connected to a mounting substrate (not illustrated). The functional element is connected to an external circuit or a ground potential via the terminal electrode 28.

A through-electrode 26 is preferably provided in the cover portion 20 and the support layer 22 in a lamination direction (Z-axis direction in FIG. 1), and the terminal electrode 28 on the cover portion 20 and the functional element 30 on the piezoelectric substrate 24 are connected to each other by the through-electrode 26.

A portion of a wiring pattern 34 connecting the functional elements 30 to each other is preferably provided on the second surface 37 of the cover portion 20. The wiring pattern 34 is connected to the functional element 30 on the piezoelectric substrate 24 by a through-electrode 32. Although not clearly illustrated, among the wiring patterns that connect the functional elements 30 to each other, those other than the wiring patterns 34 on the second surface 37 are on the piezoelectric substrate 24. In FIG. 1, only one wiring pattern 34 on the second surface 37 is illustrated, but a plurality of wiring patterns may be provided on the second surface 37. Further, the wiring pattern 34 may be provided on the first surface 36 facing the functional element 30.

Figure 2:
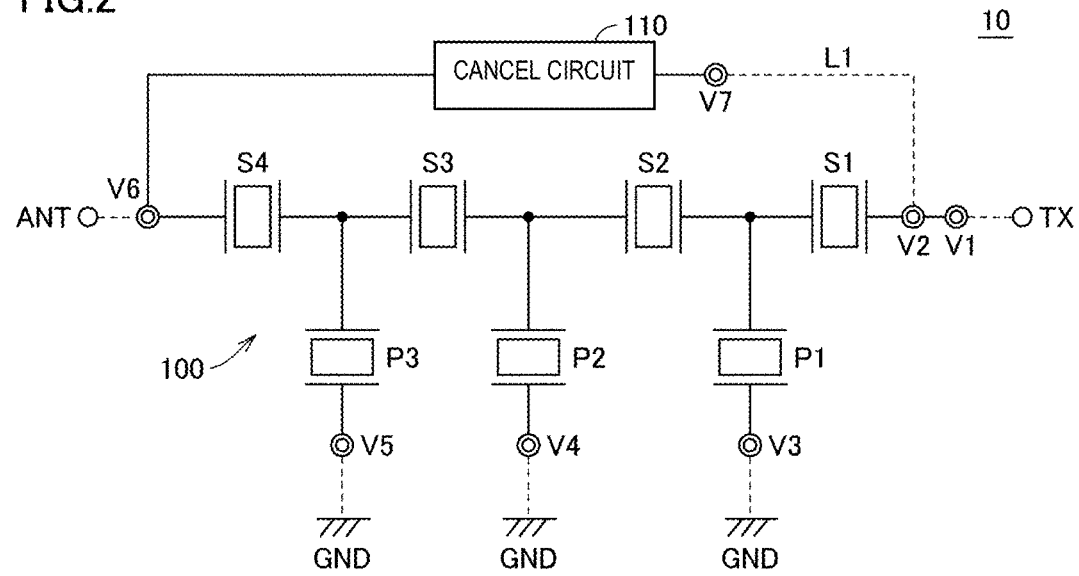
FIG. 2 is a diagram illustrating an example of an equivalent circuit of the surface acoustic wave device according to the preferred embodiment of the present invention.

FIG. 2 is a diagram illustrating an example of an equivalent circuit of the surface acoustic wave device 10 illustrated in FIG. 1. In the equivalent circuit of FIG. 2, a case where the surface acoustic wave device 10 is a transmission filter used in a communication device, such as a smartphone, for example, will be described as an example.

Referring to FIG. 2, the surface acoustic wave device 10 preferably includes a filter 100 and a cancel circuit 110.

The filter 100 is connected to a transmission circuit (not illustrated) by an input terminal TX, and is connected to an antenna (not illustrated) by an output terminal ANT. The filter 100 is preferably, for example, a ladder filter including series arm resonance portions S1 to S4 connected in series to a series arm provided between the input terminal TX and the output terminal ANT, and parallel arm resonance portions P1 to P3 provided on a parallel arm connected between the series arm and a ground potential GND. Each resonance portion is defined by one or more surface acoustic wave resonators. The filter 100 and the respective resonance portions defining the filter 100 correspond to the functional element 30 illustrated in FIG. 1. Note that the configuration of the transmission filter illustrated in FIG. 2 is an example, and other configurations may also be used as long as it is a filter defined by a surface acoustic wave resonator.

One end of the parallel arm resonance portion P1 is connected to a connection node between the series arm resonance portion S1 and the series arm resonance portion S2, and the other end thereof is connected to the ground potential GND. One end of the parallel arm resonance portion P2 is connected to a connection node between the series arm resonance portion S2 and the series arm resonance portion S3, and the other end thereof is connected to the ground potential GND. One end of the parallel arm resonance portion P3 is connected to a connection node between the series arm resonance portion S3 and the series arm resonance portion S4, and the other end thereof is connected to the ground potential GND.

The cancel circuit 110 is connected in parallel to the filter 100 between the input terminal TX and the output terminal ANT. Although not illustrated in FIG. 2, the cancel circuit 110 preferably includes an amplitude adjustment circuit and a phase adjustment circuit. The phase adjustment circuit inverts a phase of an input signal from the input terminal TX. The amplitude adjustment circuit reduces an amplitude of the input signal from the input terminal TX. The decrease amount in the amplitude is determined according to a magnitude of a signal in a blocking band in signals that have passed through the filter 100. In this way, by adding a signal having an opposite phase to the input signal to an output signal from the filter 100, an attenuation amount of the signal in the blocking band is able to be secured. The cancel circuit 110, and the amplitude adjustment circuit and phase adjustment circuit defining the cancel circuit 110 also correspond to the functional element 30 illustrated in FIG. 1.

Here, double circles indicated by V1 and V3 to V6 in FIG. 2 represent the through-electrodes 26 in FIG. 1, and double circles indicated by V2 and V7 in FIG. 2 represent the through-electrodes 32 in FIG. 1. In addition, among wiring patterns to be connected between an input/output terminal and each of the resonance portions, a wiring pattern indicated by a solid line is provided on the piezoelectric substrate 24 in FIG. 1, and a wiring pattern indicated by a broken line is provided on the second surface 37 of the cover portion 20. In the example illustrated in FIG. 2, a portion (L1 in FIG. 2) of a wiring pattern connecting the input terminal TX to the cancel circuit 110 is provided on the second surface 37 of the cover portion 20.

Figure 3A:
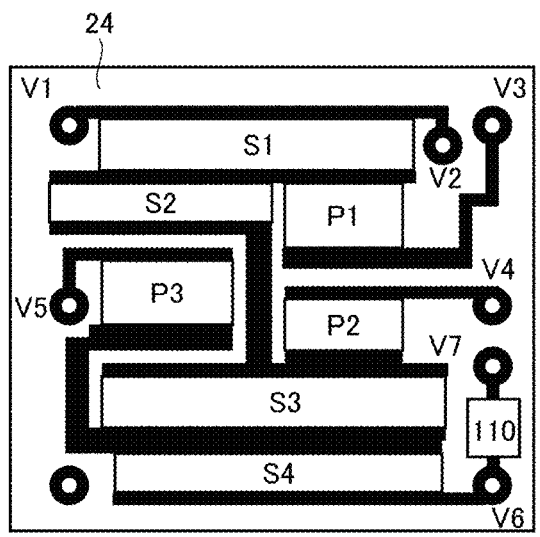
FIGS. 3A and 3B are diagrams illustrating an example of an arrangement of functional elements and wiring patterns in a piezoelectric substrate of the surface acoustic wave device of FIG. 2.
Figure 3B:
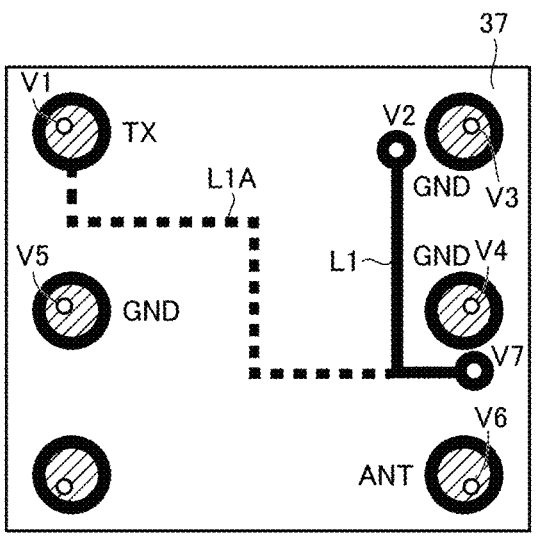

FIGS. 3A and 3B are diagrams illustrating an example of the arrangement of each resonance portion and the wiring pattern in the piezoelectric substrate of FIG. 2. FIGS. 3A and 3B are diagrams illustrating an arrangement surface of the functional elements on the piezoelectric substrate 24 of FIG. 1 and the second surface 37 of the cover portion 20, respectively when viewed from a positive direction to a negative direction of the Z-axis in the figure.

Referring to FIGS. 3A and 3B, in a piezoelectric substrate 24, the series arm resonance portion S1 is connected to the series arm resonance portion S2 and the parallel arm resonance portion P1 by the wiring pattern. The series arm resonance portion S1 is connected to the terminal TX of the second surface 37 of the cover portion 20 via the through-electrode V1. The parallel arm resonance portion P1 is connected to the terminal GND of the second surface 37 via the through-electrode V3. The series arm resonance portion S2 is connected to the series arm resonance portion S3 and the parallel arm resonance portion P2 by the wiring pattern. The parallel arm resonance portion P2 is connected to the terminal GND of the second surface 37 via the through-electrode V4.

The series arm resonance portion S3 is connected to the series arm resonance portion S4 and the parallel arm resonance portion P3 by other wiring patterns. The parallel arm resonance portion P3 is connected to the terminal GND of the second surface 37 via the through-electrode V5. The series arm resonance portion S4 is connected to the terminal ANT of the second surface 37 via the through-electrode V6.

One end of the cancel circuit 110 is connected to the terminal ANT of the second surface 37 via the through-electrode V6, similarly to the series arm resonance portion S4. The other end of the cancel circuit 110 is connected to one end of the wiring pattern L1 of the second surface 37 via the through-electrode V7. The other end of the wiring pattern L1 is connected to a wiring pattern which is connected to the through-electrode V1 (i.e., the terminal TX) on the piezoelectric substrate 24 via the through-electrode V2. Alternatively, as illustrated in a wiring pattern L1A in FIG. 3B, the through-electrode V7 and the terminal TX may be directly connected to each other on the second surface 37.

Figure 4A:
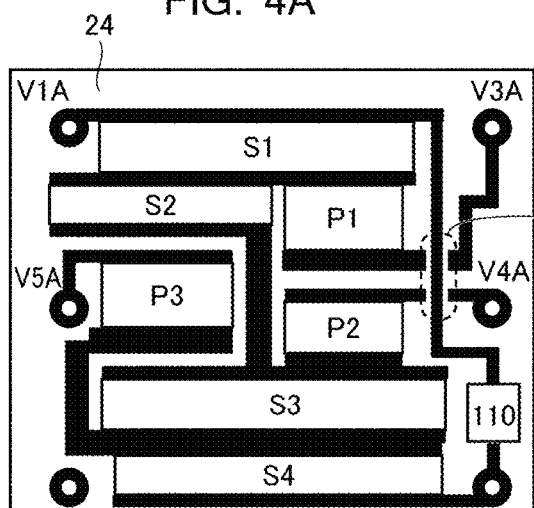
FIGS. 4A and 4B are layout diagrams of a comparative example in which the functional elements and the wiring patterns are arranged only on a surface of the piezoelectric substrate of the surface acoustic wave device.
Figure 4B:
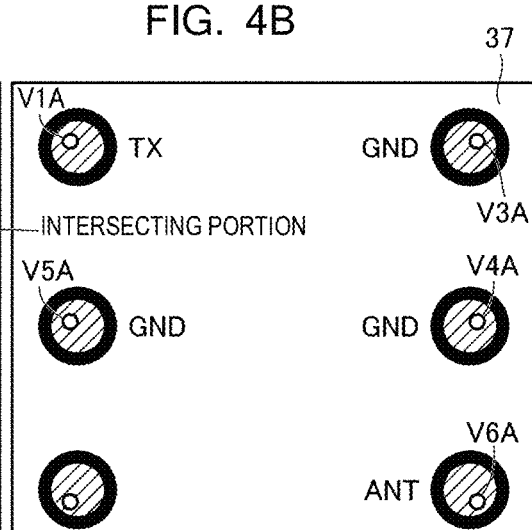

FIGS. 4A and 4B are diagrams illustrating a comparative example in which all the functional elements and wiring patterns of the same circuit as in FIGS. 3A and 3B are on the surface of the piezoelectric substrate 24. Comparing FIG. 3A and FIG. 4A, it can be seen that a wiring pattern connecting the cancel circuit 110 and the series arm resonance portion S1 sterically intersects with other wiring patterns. In this manner, when the wiring patterns are intersected, it is necessary to provide an insulating film between the overlapping wiring patterns. Alternatively, in order to eliminate the intersection of such wiring patterns, it is necessary to provide a wiring pattern on an outer side portion of other functional elements or wiring patterns (i.e., along an outer periphery of the piezoelectric substrate 24). Then, a surface area of the piezoelectric substrate 24 needs to be further enlarged, resulting in an increase in the size of the device.

As illustrated in FIG. 3A of the present preferred embodiment, by providing the wiring pattern connecting the cancel circuit 110 and the series arm resonance portion S1 on the second surface 37 of the cover portion 20, intersecting portions of the wiring patterns on the piezoelectric substrate 24 as illustrated in FIG. 4A are able to be eliminated, and the surface area of the piezoelectric substrate 24 is able to be prevented from being enlarged. In this case, when the piezoelectric substrate 24 and the cover portion 20 are viewed in a plan view, the wiring pattern on the cover portion 20 intersects with a portion of the wiring pattern on the piezoelectric substrate 24. Further, by arranging the wiring pattern on the cover portion 20, it is also possible to design the wiring pattern on the cover portion 20 so as to overlap with the functional element of the piezoelectric substrate 24 when the piezoelectric substrate 24 and the cover portion 20 are viewed in a plan view.

Although in FIG. 2 and FIGS. 3A and 3B, an example in which a portion of the wiring pattern connecting the cancel circuit 110 and the input terminal TX is provided on the second surface 37 of the cover portion 20 is described, a portion of the wiring pattern connecting the cancel circuit 110 and the output terminal ANT may be further provided on the second surface 37 in addition to the wiring pattern L1 on the second surface 37 depending on the arrangement of the cancel circuit 110. Alternatively, only the wiring pattern connecting the cancel circuit 110 and the output terminal ANT may be provided on the second surface 37.

Figure 5:
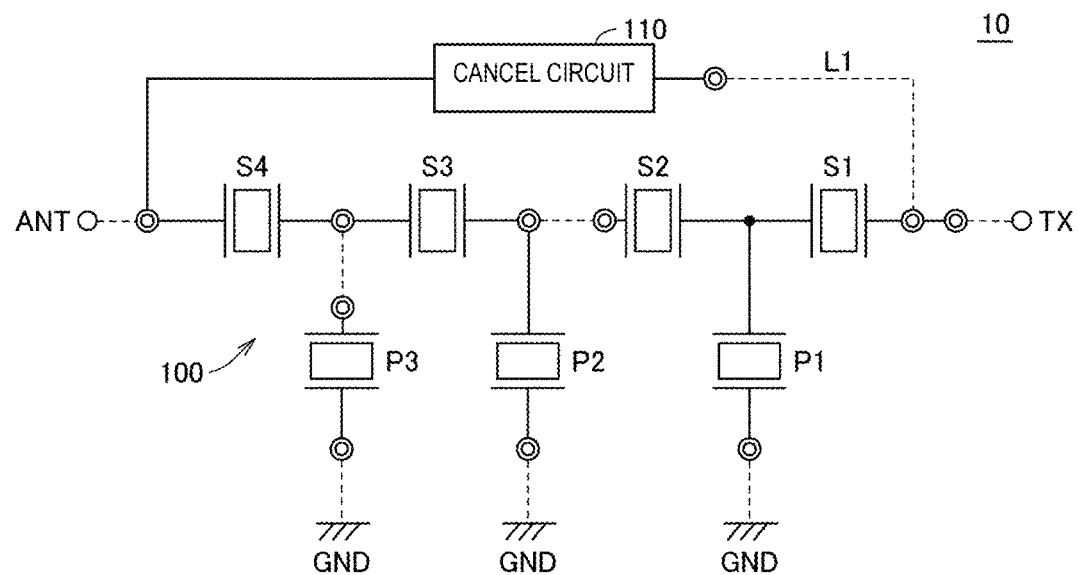
FIG. 5 is a diagram illustrating another example of the equivalent circuit of a surface acoustic wave device according to a preferred embodiment of the present invention.

Further, as in an equivalent circuit illustrated in FIG. 5, in place of or in addition to the wiring pattern connecting the cancel circuit 110 and the input/output terminal, a portion of the wiring pattern connecting the resonance portions defining the filter 100 may be provided on the second surface 37 of the cover portion 20, thus securing a space on the piezoelectric substrate 24. In this case, by appropriately arranging the functional elements on the piezoelectric substrate 24 so as to fill up an empty space, it is also possible to reduce the surface area of the piezoelectric substrate 24, thus making it possible to reduce the size of the device.

In this manner, by providing a portion of the wiring pattern connecting the filter 100 and the cancel circuit 110 and/or a portion of the wiring pattern connecting between the resonance portions defining the filter 100 on the second surface 37 of the cover portion 20, even when the cancel circuit 110 is added, the piezoelectric substrate 24 is able to be prevented from becoming larger. Further, since the wiring patterns is able to be arranged so as not to intersect each other on the piezoelectric substrate 24, the degree of freedom in design is improved.

Figure 6:
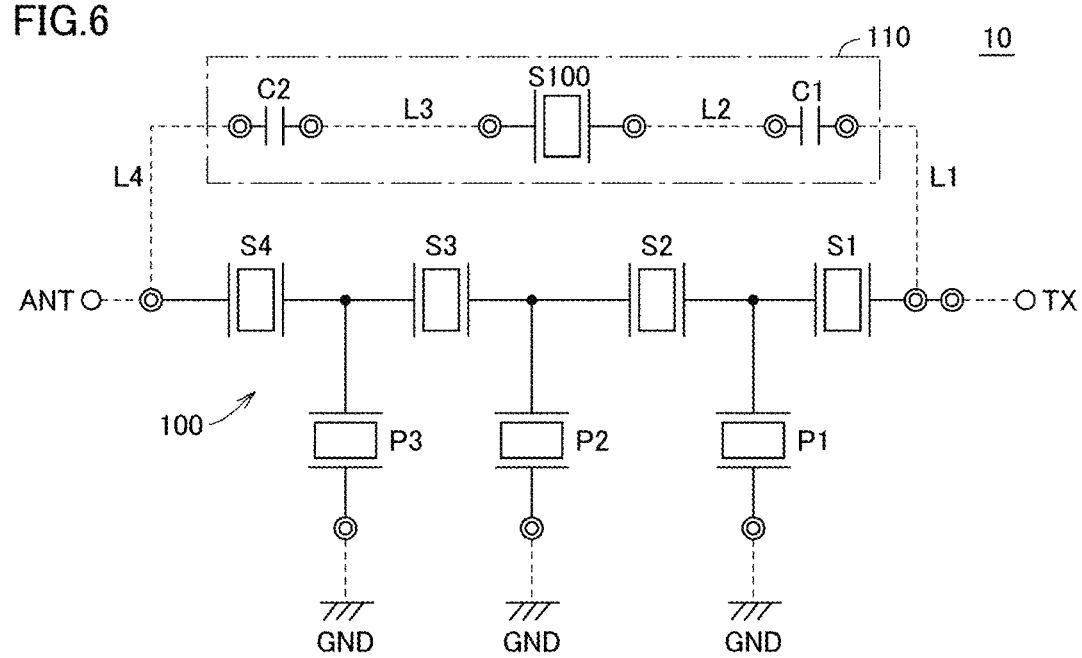
FIG. 6 is a diagram illustrating details of a cancel circuit in FIG. 2.

FIG. 6 is a diagram illustrating details of the cancel circuit 110 in FIG. 2. Referring to FIG. 6, the cancel circuit 110 preferably includes capacitors C1 and C2 defining and functioning as the amplitude adjustment circuit, and a surface acoustic wave vibrator S100 defining and functioning as the phase adjustment circuit.

One end of the capacitor C1 is connected to the input terminal TX, and the other end thereof is connected to one end of the surface acoustic wave vibrator S100. The other end of the surface acoustic wave vibrator S100 is connected to one end of the capacitor C2. The other end of the capacitor C2 is connected to the output terminal ANT.

Here, the functional elements of the capacitors C1, C2 and the surface acoustic wave vibrator S100 are provided on the piezoelectric substrate 24, but at least one of a portion of a wiring pattern connecting the capacitor C1 and the surface acoustic wave vibrator S100 (L2 in FIG. 5) and a portion of a wiring pattern connecting the surface acoustic wave vibrator S100 and the capacitor C2 (L3 in FIG. 5) is provided on the second surface 37 of the cover portion 20. That is, at least a portion of the wiring pattern from the input terminal TX to the output terminal ANT via the cancel circuit 110 (at least a portion of wiring patterns L1 to L4) is provided on the second surface 37 of the cover portion 20.

It should be noted that it is not essential to define the amplitude adjustment circuit with two capacitors, and only one of the capacitors C1 and C2 may be provided if so desired.

Since a portion of the wiring pattern connecting the functional elements defining the cancel circuit 110 is provided on the second surface 37 of the cover portion 20, the space of the wiring pattern required for the piezoelectric substrate 24 is reduced, so that an increase in the device size is further reduced or prevented.

In the present preferred embodiment, the example is described in which the functional element on the piezoelectric substrate and the wiring pattern on the cover portion are connected by the through-electrode. In a first variation, a description will be provided of an example in which the functional element on the piezoelectric substrate and the wiring pattern of the cover portion are connected to each other using a wiring pattern provided on a side surface of the cover portion.

Figure 7:
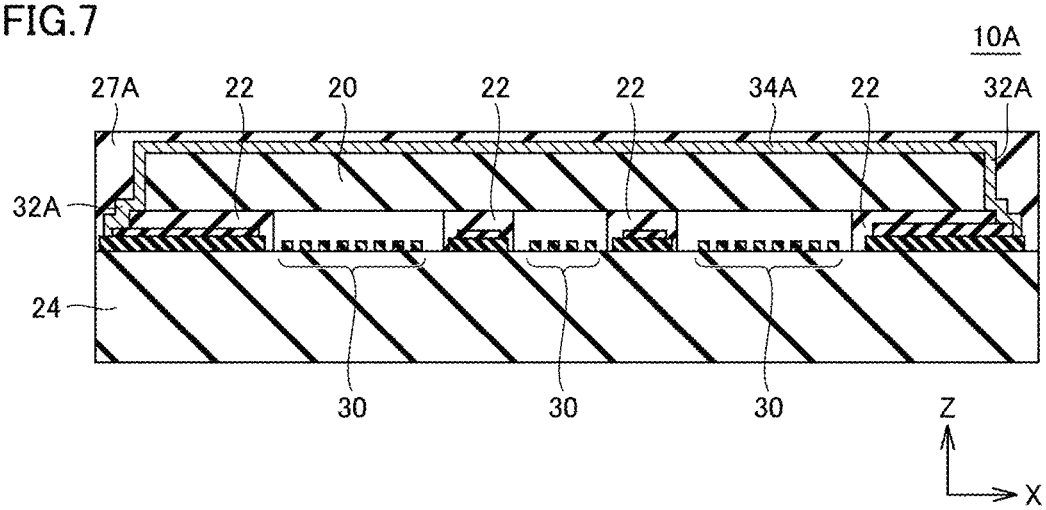
FIG. 7 is a cross-sectional view of a first variation on a preferred embodiment of the present invention.

FIG. 7 is a cross-sectional view of a surface acoustic wave device 10A according to a first variation of a preferred embodiment of the present invention. In FIG. 7, the cover portion 20 and the support layer 22 are arranged in a box-shaped protective resin 27A provided on the piezoelectric substrate 24. A wiring pattern 34A on the second surface 37 of the cover portion 20 extends to the piezoelectric substrate 24 along the side surface of the cover portion 20, and is connected to the functional element 30 on the piezoelectric substrate 24.

Figure 8A:
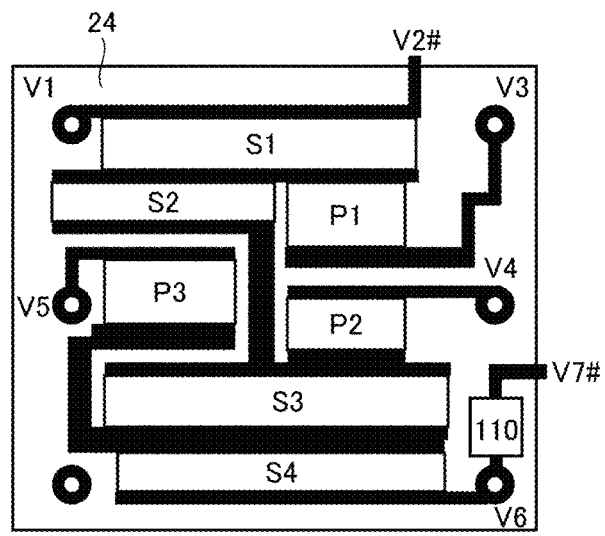
FIGS. 8A and 8B are diagrams illustrating an example of the arrangement of functional elements and wiring patterns in the piezoelectric substrate of a surface acoustic wave device of FIG. 7.
Figure 8B:
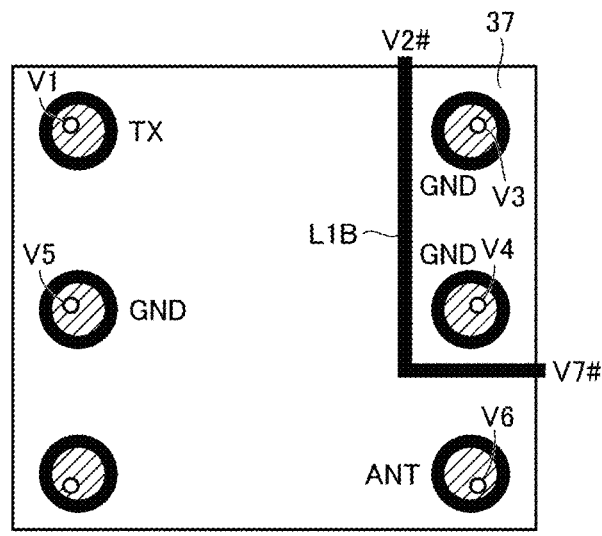

FIGS. 8A and 8B are diagrams illustrating an example of an arrangement of functional elements and wiring patterns on the piezoelectric substrate 24 of a surface acoustic wave device 10A illustrated in FIG. 7. In FIGS. 8A and 8B, one end of a wiring pattern L1B on the second surface 37 is connected to the cancel circuit 110 on the piezoelectric substrate 24 by a wiring pattern V7# on the side surface of the cover portion 20 in FIGS. 8A and 8B. Further, the other end of the wiring pattern L1B is connected to a wiring pattern connecting the series arm resonance portion S1 and the through-electrode V1 on the piezoelectric substrate 24 by a wiring pattern V2# on the side surface of the cover portion 20.

As in the first variation, also by connecting the wiring pattern on the cover portion and the functional element on the piezoelectric substrate using the wiring pattern on the side surface, the surface area occupied by the functional element and the wiring pattern is able to be reduced on the piezoelectric substrate, and the degree of freedom in design is improved similarly to the example illustrated in FIG. 1.

Note that in the example illustrated in FIGS. 8A and 8B, although an example in which both end portions of the wiring pattern L1B are lead to the piezoelectric substrate 24 by the wiring patterns on the side surfaces is described, a configuration in which the wiring pattern on the side surface is used for any one end portion and the through-electrode is used for the other end portion may also be provided.

In the present preferred embodiment, the surface acoustic wave device is explained in the case of transmission filter of a communication device, but the configuration of the present preferred embodiment is also applicable to a case of a reception filter of the communication device.

Figure 9:
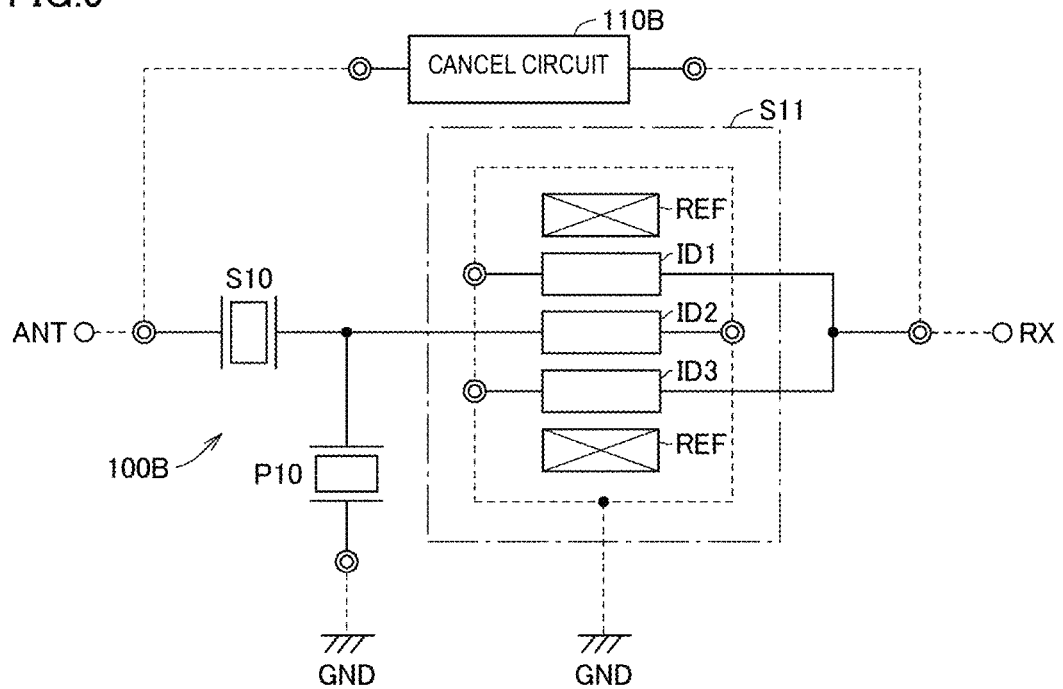
FIG. 9 is a diagram illustrating an equivalent circuit of a second variation of a preferred embodiment of the present invention in a case of a longitudinally coupled resonator filter.

FIG. 9 is a diagram illustrating an example of an equivalent circuit in the case where the surface acoustic wave device is a reception filter. Referring to FIG. 9, the surface acoustic wave device 10B includes a filter 100B and a cancel circuit 110B.

The filter 100B is connected to the antenna (not illustrated) by an input terminal ANT, and is connected to a reception circuit (not illustrated) by an output terminal RX. The filter 100B is preferably a filter including series arm resonance portions S10 and S11 connected in series to a series arm provided between the input terminal ANT and the output terminal RX, and a parallel arm resonance portion P10 connected between the series arm and the ground potential GND.

The series arm resonance portion S11 defines a longitudinally coupled resonator filter. The series arm resonance portion S11 includes IDT electrodes ID1 to ID3 and a reflector REF.

One end of the IDT electrode ID2 is connected to the series arm resonance portion S10, and the other end thereof is connected to the ground potential GND via the through-electrode. The IDT electrode ID1 is arranged adjacent to a side surface on one side of the IDT electrode ID2. The IDT electrode ID3 is arranged adjacent to a side surface on the other side of the IDT electrode ID2. One end of each of the IDT electrodes ID1 and ID3 is connected to the output terminal RX. The other end of each of the IDT electrodes ID1 and ID3 is connected to the ground potential GND via the through-electrode. The reflector REF is arranged adjacent to each of the IDT electrodes ID1 and ID3.

As can be seen from FIG. 9, in such a longitudinally coupled resonator filter, when the wiring pattern (corresponding to a portion indicated by a broken line in FIG. 9) to the ground potential GND is provided on the piezoelectric substrate 24, portions intersecting with the wiring pattern connecting the IDT electrodes ID1 and ID3, and the output terminal RX may be generated. Therefore, in a case where the wiring pattern is provided only on the piezoelectric substrate 24, it is necessary to provide such a three dimensional configuration in which an insulating layer is provided between the wiring patterns in the intersecting portions.

However, as illustrated in FIG. 9, since the wiring pattern that connects to the ground potential GND is provided on the second surface 37 of the cover portion 20, the intersecting portions of the wiring patterns on the piezoelectric substrate 24 are able to be eliminated, so that the manufacturing process is simplified and the manufacturing cost are reduced.

Note that, also in the case of the reception filter, a portion of the wiring pattern connecting the filter 100B and the cancel circuit 110B may be further provided on the second surface 37 of the cover portion 20. Also, the configuration of the first variation may be further applied to the second variation.

In the present preferred embodiment, the case where the cancel circuit is applied when the surface acoustic wave device is either the transmission filter or the reception filter has been described. In a third variation of a preferred embodiment of the present invention, the cancel circuit may also be applied to a duplexer in which a transmission filter 210 and a reception filter 220 are provided in one device as in a surface acoustic wave device 200 illustrated in FIG. 10. In this case, in addition to a cancel circuit 250 connected in parallel to the transmission filter 210 and a cancel circuit 260 connected in parallel to the reception filter 220, it is possible to also provide a cancel circuit 270 between a transmission terminal TX that connects to a transmission circuit 310 and a reception terminal RX that connects to a reception circuit 320.

In such a duplexer, since the antenna terminal ANT is shared by the transmission filter 210 and the reception filter 220, when a transmission signal is output from the transmission circuit 310 to an antenna 300, the transmission signal is also able to be transmitted to the reception circuit 320 via the reception filter 220. Further, depending on a distance between a wiring pattern connecting the transmission terminal TX and the transmission filter 210 and a wiring pattern connecting the reception filter 220 and the reception terminal RX, a signal on a transmission side may be leaked to a reception side due to capacitance coupling between the wiring patterns. Therefore, by providing the cancel circuit 270 between the transmission terminal TX and the reception terminal RX, it is possible to eliminate the influence of the transmission signal on the reception signal.

When the cancel circuit is provided in such a duplexer, at least a portion of wiring patterns (L10, L11, L20, L21, L30 and L31 in FIG. 10) to be connected to each cancel circuit is preferably provided on the second surface 37 of the cover portion 20, thus reducing or preventing an increase in the size of the device while securing an attenuation amount in the blocking band in each filter.

Figure 10:
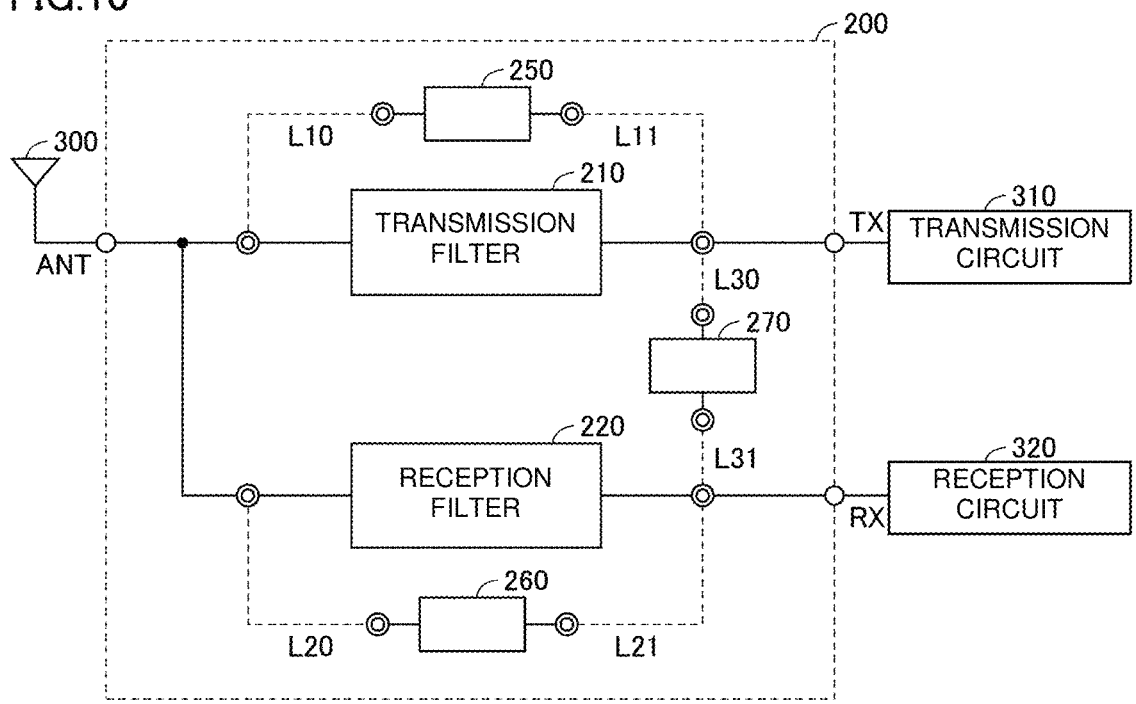
FIG. 10 is a diagram that explains an arrangement of a cancel circuit in an example of a surface acoustic wave device having both a transmission filter and a reception filter.

Although not illustrated in FIG. 10, each of the cancel circuits 250, 260, and 270 illustrated in FIG. 10 may also be provided with a portion of the wiring pattern connecting the internal functional elements on the cover portion 20 as illustrated in FIG. 5. Moreover, it is not necessary to provide all of the cancel circuits, and a configuration in which a portion of the cancel circuits 250, 260, and 270 is provided may be adopted. The first and second variations described above may also be applied to the configuration of the third variation.

In the above-described preferred embodiments, the configuration in which a portion of the wiring pattern connecting the functional elements is provided on the second surface 37 of the cover portion 20 has been described, but instead or in addition thereto, the wiring pattern may be provided on the first surface 36 opposed to the functional element 30 in the cover portion 20.

As described above, in the surface acoustic wave device, a portion of the wiring pattern connecting the functional elements is provided on the cover portion of the surface acoustic wave device, thus securing a space that houses the cancel circuit on the piezoelectric substrate on which the functional element is arranged, and reducing a space on the piezoelectric substrate which is required due to the addition of the cancel circuit. Thus, the attenuation characteristics in the blocking band are improved by the addition of the cancel circuit, and it is possible to reduce or prevent the increase in the size of the surface acoustic wave device and to improve the degree of freedom in designing the surface acoustic wave device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate;
a plurality of functional elements on the piezoelectric substrate;
a cover portion that opposes the piezoelectric substrate with a support layer interposed between the piezoelectric substrate and the cover portion, and that includes a first surface facing the piezoelectric substrate and a second surface opposite to the first surface; and
an input terminal, an output terminal, and at least one wiring pattern on the cover portion; wherein
at least a portion of the plurality of functional elements includes an interdigital transducer (IDT) electrode, and a surface acoustic wave resonator is defined by the piezoelectric substrate and the IDT electrode;
the plurality of functional elements include:
 a filter that passes input signals in a predetermined frequency band in input signals from the input terminal to the output terminal; and
 a cancel circuit connected to the filter in parallel between the input terminal and the output terminal;
the cancel circuit attenuates output signals outside the predetermined frequency band in signals output from the output terminal;
the at least one wiring pattern includes a portion of a wiring pattern connecting a first functional element and a second functional element included in the plurality of functional elements that is provided on the second surface of the cover portion;
the portion of the wiring pattern has a potential different from a reference potential;
when the piezoelectric substrate is viewed in a plan view, the portion of the wiring pattern overlaps with a wiring pattern on the piezoelectric substrate connected to the reference potential; and
in the plan view, the portion of the wiring pattern does not overlap with a wiring pattern on the piezoelectric substrate that is connected in series between the input terminal and the output terminal.

2. The surface acoustic wave device according to claim 1, wherein
the piezoelectric substrate is provided with a first through-electrode and a second through-electrode penetrating through the support layer and the cover portion; and
the portion of the wiring pattern on the second surface of the cover portion is connected to the first functional element by the first through-electrode, and is connected to the second functional element by the second through-electrode.

3. The surface acoustic wave device according to claim 1, further comprising:
a protective resin covering the second surface opposite to the first surface facing the piezoelectric substrate on the cover portion; wherein
the portion of the wiring pattern on the second surface of the cover portion is provided between the protective resin and the second surface of the cover portion; and
the portion of the wiring pattern on the second surface of the cover portion is connected to the first functional element via a first wiring provided on a first side surface of the cover portion, and is connected to the second functional element via a second wiring provided on a second side surface of the cover portion.

4. The surface acoustic wave device according to claim 3, wherein the plurality of functional elements are housed in at least once space defined between the cover portion, the support layer, and the piezoelectric substrate.

5. The surface acoustic wave device according to claim 1, wherein at least a portion of the wiring pattern on the piezoelectric substrate connected to the reference potential intersects with the at least one wiring pattern on the cover portion when the piezoelectric substrate is viewed in the plan view.

6. The surface acoustic wave device according to claim 1, wherein the plurality of functional elements at least partially overlap with the at least one wiring pattern on the cover portion when the piezoelectric substrate is viewed in the plan view.

7. The surface acoustic wave device according to claim 1, wherein the at least one wiring pattern includes at least a portion of a wiring pattern connecting the functional elements included in the filter to each other and at least a portion of a wiring pattern extending from the input terminal to the output terminal through the cancel circuit that are provided on the cover portion.

8. The surface acoustic wave device according to claim 7, wherein
the first functional element is the filter;
the second functional element is the cancel circuit; and
the at least one wiring pattern includes at least a portion of a wiring pattern connecting the filter and the cancel circuit that is provided on the cover portion.

9. The surface acoustic wave device according to claim 1, wherein
the filter is a reception filter;
the input terminal is connected to an antenna, and the output terminal is connected to a reception circuit; and
the cancel circuit is connected in parallel to the reception filter.

10. The surface acoustic wave device according to claim 1, wherein
the filter is a transmission filter;
the input terminal is connected to a transmission circuit, and the output terminal is connected to an antenna; and
the cancel circuit is connected in parallel to the transmission filter.

11. The surface acoustic wave device according to claim 1, wherein
the cancel circuit includes:
 an amplitude adjustment circuit that adjusts an amplitude of the input signal; and
 a phase adjustment circuit that adjusts a phase of the input signal;
the first functional element is the amplitude adjustment circuit, and the second functional element is the phase adjustment circuit; and the at least one wiring pattern includes at least a portion of a wiring pattern connecting the amplitude adjustment circuit and the phase adjustment circuit that is provided on the cover portion.

12. The surface acoustic wave device according to claim 11,
wherein capacitors define the amplitude adjustment circuit, and a surface acoustic wave vibrator defines the phase adjustment circuit.

13. The surface acoustic wave device according to claim 1, wherein
the cancel circuit further includes:
  a first amplitude adjustment circuit that adjusts an amplitude of the input signal;
  a phase adjustment circuit that adjusts a phase of a signal from the first amplitude adjustment circuit; and
  a second amplitude adjustment circuit that adjusts an amplitude of a signal from the phase adjustment circuit;
the first functional element is the phase adjustment circuit;
the second functional element is at least one of the first amplitude adjustment circuit and the second amplitude adjustment circuit; and
the at least one wiring pattern includes at least one of a wiring pattern connecting the first amplitude adjustment circuit and the phase adjustment circuit, and a wiring pattern connecting the phase adjustment circuit and the second amplitude adjustment circuit that is provided on the cover portion.

14. The surface acoustic wave device according to claim 1, wherein
the filter includes:
  a transmission filter that filters a signal from a transmission circuit received at a first terminal and outputs the signal to an antenna; and
  a reception filter that filters a signal received from the antenna and outputs the signal to a reception circuit from a second terminal;
the cancel circuit reduces an influence of a signal received at the first terminal on a signal output from the second terminal; and
the at least one wiring pattern includes a portion of a wiring pattern connected to the second terminal from the first terminal through the cancel circuit that is provided on the cover portion.

15. The surface acoustic wave device according to claim 1,
wherein the piezoelectric substrate is made from a single crystal material of any one of lithium tantalate ($LiTaO_3$), lithium niobate ($LiNbO_3$), alumina ($Al_2O_3$), and sapphire, or a laminated material made of $LiTaO_3$, $LiNbO_3$, or silicon (Si).

16. The surface acoustic wave device according to claim 15,
wherein capacitors define a first amplitude adjustment circuit, and a surface acoustic wave vibrator defines a phase adjustment circuit.

17. A ladder filter comprising;
the surface acoustic wave device according to claim 1; wherein
the ladder filter includes:
  a further input terminal and a further output terminal;
  series arm resonance portions; and
  parallel arm resonance portions;
the series arm resonance portions are connected in series to a series arm provided between the further input terminal and the further output terminal; and
the parallel arm resonance portions are provided on a parallel arm connected between the series arm and a ground potential.

18. The ladder filter according to claim 17, wherein at least one of the series arm portions defines a longitudinally coupled resonator filter including the surface acoustic wave resonator.

19. The surface acoustic wave device according to claim 1, further comprising:
a protective resin covering the second surface of the cover portion opposite to the first surface of the cover portion facing the piezoelectric substrate; wherein
the at least one wiring pattern on the cover portion is disposed between the protective resin and the second surface of the cover portion; and
the input terminal and the output terminal extend through the protective resin covering.

20. The surface acoustic wave device according to claim 1,
wherein the plurality of functional elements are housed in at least once space defined between the piezoelectric substrate, the support layer, and the cover portion.

* * * * *